(12) United States Patent
Wang et al.

(10) Patent No.: US 7,871,878 B2
(45) Date of Patent: Jan. 18, 2011

(54) METHOD OF FABRICATING PMOS AND NMOS TRANSISTOR ON THE SAME SUBSTRATE

(75) Inventors: Junli Wang, Kanagawa (JP); Toyotaka Kataoka, Kanagawa (JP); Masaki Saito, Tokyo (JP)

(73) Assignee: Sony Corporation, Tokyo (JP)

( * ) Notice: Subject to any disclaimer, the term of this patent is extended or adjusted under 35 U.S.C. 154(b) by 105 days.

(21) Appl. No.: 12/425,476

(22) Filed: Apr. 17, 2009

(65) Prior Publication Data

US 2009/0221134 A1 Sep. 3, 2009

Related U.S. Application Data

(62) Division of application No. 11/241,108, filed on Sep. 30, 2005, now Pat. No. 7,538,390.

(30) Foreign Application Priority Data

Oct. 7, 2004 (JP) ............... 2004-294562

(51) Int. Cl.
*H01L 21/8238* (2006.01)
*H01L 27/118* (2006.01)

(52) U.S. Cl. ............... 438/199; 438/285; 438/479; 257/204; 257/288; 257/347; 257/616; 257/E27.046; 257/E21.632

(58) Field of Classification Search ............... None
See application file for complete search history.

(56) References Cited

U.S. PATENT DOCUMENTS 6,633,066 B1 10/2003 Bae et al.
7,253,045 B1 8/2007 Wristers et al.
7,348,259 B2 3/2008 Cheng et al.
7,538,390 B2 * 5/2009 Wang et al. ............... 257/347
2005/0221550 A1 10/2005 Fitzgerald
2005/0274978 A1 12/2005 Antoniadis et al.

FOREIGN PATENT DOCUMENTS

| JP | 59-177957 A | 10/1984 |
|---|---|---|
| JP | 04-372166 A | 12/1992 |
| JP | 09-219524 A | 8/1997 |
| JP | 2000-286418 A | 10/2000 |
| JP | 2001-044425 A | 2/2001 |
| JP | 2001-160594 A | 6/2001 |
| JP | 2001-338988 A | 12/2001 |
| JP | 2002-198533 A | 7/2002 |
| JP | 2002-359367 A | 12/2002 |
| JP | 2003-017671 A | 1/2003 |

OTHER PUBLICATIONS

Japanese Patent Office, Office Action issued in Patent Application JP 2004-294562, on Oct. 27, 2009.

* cited by examiner

*Primary Examiner*—Alonzo Chambliss
(74) *Attorney, Agent, or Firm*—SNR Denton US LLP (57) ABSTRACT

A method of manufacturing a semiconductor device that includes a first and second device regions on a substrate. The method includes the steps of forming an insulation layer on the substrate, laminating a first semiconductor layer having a plane orientation different from the surface of the substrate on the insulation layer and exposing the substrate by removing the insulation layer and the first semiconductor layer from the second device region. A second semiconductor layer having the same plane orientation as the substrate and that is made of a strained layer is formed by epitaxial growth on the exposed substrate in the second device region.

6 Claims, 10 Drawing Sheets

METHOD OF FABRICATING PMOS AND NMOS TRANSISTOR ON THE SAME SUBSTRATE

RELATED APPLICATION DATA

This application is a division of U.S. application Ser. No. 11/241,108, entitled "SEMICONDUCTOR DEVICE AND METHOD OF MANUFACTURING SEMICONDUCTOR DEVICE," filed on Sep. 30, 2005, the entirety of which is incorporated herein by reference to the extent permitted by law. The present invention claims priority to Japanese Patent Application No. JP 2004-294562, filed Oct. 7, 2004, the entirety of which is also incorporated herein by reference to the extent permitted by law.

BACKGROUND OF THE INVENTION

The present invention relates to a semiconductor device and a method of manufacturing a semiconductor device, particularly to a semiconductor device including a CMOS transistor (CMOS) in which a channel layer includes a strained layer and a method of manufacturing the same.

In semiconductor devices, particularly CMOS devices, there have been conducted enhancement of drive capability and reduction in power consumption from the viewpoint of enhancing the performance of the devices, and these developments have been made by thinning the gate insulation film and miniaturizing the gate structure. However, due to the conspicuous tendencies toward an increased leak current, a short channel effect and the like; it has been becoming difficult to enhance the drive capability by simple miniaturization.

In view of this, in recent years, for enhancing the device performance, a trial to utilize a heterostructure of silicon (Si) and silicon-germanium (SiGe) has been made. For example, it is known that when, to enhance the speed of an NMOS transistor (NMOS), a mixed crystal layer of Si and germanium (Ge) larger in lattice constant than Si is grown on an Si substrate, thereby forming a relaxed SiGe layer in a lattice relaxed state, then a strained Si layer in a tension-strained state is formed thereon, and a channel region is formed in the strained Si layer, the carrier mobility (electron mobility) in the channel region is enhanced. It is also known that when, in order for example to enhance the speed of a PMOS transistor (PMOS), a strained SiGe layer in a compression-strained state is formed on an Si substrate, and a channel region is formed in the strained SiGe layer, the carrier mobility (hole mobility) in the channel region is enhanced.

Based on the above, an example of CMOS device has been reported in which a strained Si layer is used as the NMOS channel region and a strained SiGe layer is used as the PMOS channel region. Such a CMOS device has been manufactured by a method in which a relaxed SiGe layer, a strained Si layer and a strained SiGe layer are laminatingly formed on an Si substrate, the strained SiGe layer is removed and the strained Si layer is removed to a certain level of depth in the NMOS region, thereby exposing the strained Si layer having a high coefficient of straining, then the channel region of the NMOS transistor is formed in the strained Si layer thus exposed, and the channel region of the PMOS transistor is formed in the strained SiGe layer, to manufacture the CMOS device (see, for example, Japanese Patent Laid-open No. Hei 10-93025).

On the other hand, it has been reported that in NMOS, the electron mobility is higher in the order (100)>(111)>(110) in terms of the plane orientation of the surface of the Si substrate, whereas in PMOS, the hole mobility is higher in the order of (110)>(111)>(100) in terms of the plane orientation of the surface of the Si substrate (See M. Yang et al, "IEEE Electron Device Letters" (USA), 2003, Vol. 24, p. 339, for example).

SUMMARY OF THE INVENTION

However, sufficient carrier mobility cannot be obtained even with the above-mentioned CMOS device in which the strained Si layer is used for the NMOS channel region and the strained SiGe layer is used for the PMOS channel region. In addition, in the above-mentioned method of manufacturing a CMOS device, the strained SiGe layer and the strained Si layer to a certain level of thickness are removed so as to expose the strained Si layer, on the NMOS region side, so that a step is generated between the NMOS region and the PMOS region. Therefore, even in the case where gate electrodes in the regions are formed and then an insulation film is formed in the state of covering the gate electrodes to achieve leveling, the step is liable to be left, and the leveling property of the insulation film tends to be worsened. As a result, the process margin at the time of light exposure or etching for forming contact holes thereafter would be small, and the contact holes would not be formed with high accuracy.

Furthermore, in an Si substrate of which the surface has a plane orientation of (100) and which is used ordinarily, the hole mobility obtained in PMOS is not sufficient, although the electron mobility in NMOS is high.

In order to solve the above-mentioned problems, according to the present invention, there is provided a semiconductor device including a first device region and a second device region in the same substrate, wherein the semiconductor device includes: a first semiconductor layer provided on the substrate in the first device region and having a plane orientation different from that of the surface of the substrate; and a second semiconductor layer provided on the substrate in the second device region and including a strained layer having the same plane orientation with that of the surface of the substrate.

According to such a semiconductor device, there are provided the first semiconductor layer provided on the substrate in the first device region and having a plane orientation different from that of the surface of the substrate, and the second semiconductor layer provided on the substrate in the second device region and having the same plane orientation with that of the surface of the substrate. This makes it possible to provide the first semiconductor layer and the second semiconductor layer with respective plane orientations optimum for enhancing the carrier mobility, in both the first device region and the second device region. In addition, since the second semiconductor layer includes a strained layer, the carrier mobility in the second semiconductor layer can be further enhanced. Where the first semiconductor layer is also comprised of a strained layer, the carrier mobilities in both the first device region and the second device region can be further enhanced.

In addition, according to the present invention, there is provided a method of manufacturing a semiconductor device including a first device region and a second device region in the same substrate, wherein the following steps are sequentially carried out. In a first step, an insulation layer is formed on the substrate, and a first semiconductor layer having a plane orientation different from that of the surface of the substrate is laminated on the insulation layer. Next, in a second step, the insulation layer and the first semiconductor layer are removed to expose the substrate in the second device region. Subsequently, in a third step, a second semiconductor layer including a strained layer is epitaxially grown on the exposed substrate in the second device region in the condition of maintaining the plane orientation of the surface of the substrate.

According to such a method of manufacturing a semiconductor device, the first semiconductor layer having a plane orientation different from that of the surface of the substrate is formed on the substrate in the first device region, so that the first semiconductor layer and the second semiconductor layer different in plane orientation are formed respectively in the first device region and the second device region which are provided in the same substrate. This ensures that the first semiconductor layer and the second semiconductor layer are formed with respective plane orientations optimum for enhancing the carrier mobilities, whereby the carrier mobilities in the first device region and the second device region can be enhanced. In addition, the second semiconductor layer is composed of a strained layer, whereby the carrier mobility in the first device region can be further enhanced. Where the first semiconductor layer is also composed of a strained layer, the carrier mobilities in both the first device region and the second device region can be further enhanced. Besides, since the second semiconductor layer is grown on the substrate having been deprived of the insulation layer and the first semiconductor layer in the second device region, the generation of a step between the first device region and the second device region is restrained.

As has been described above, according to the semiconductor device and the method of manufacturing the same of the present invention, the carrier mobilities in the first device region and the second device region which are provided in the same substrate can be enhanced. As a result, in the case where the first device region is one of an NMOS region and a PMOS region in a CMOS device and the second device region is the other of the NMOS region and the PMOS region, the carrier mobility can be enhanced in both the NMOS region and the PMOS region, so that the CMOS device performance can be enhanced. In addition, since the generation of a step between the NMOS region and the PMOS region is restrained, contact holes for connection to a transistor formed in each of the regions can be formed with high accuracy, and he yield can be enhanced.

DETAILED DESCRIPTION OF THE PRESENTLY PREFERRED EMBODIMENTS

Now, embodiments of the present invention will be described in detail below, based on the drawings.

First Embodiment

Figure 1:
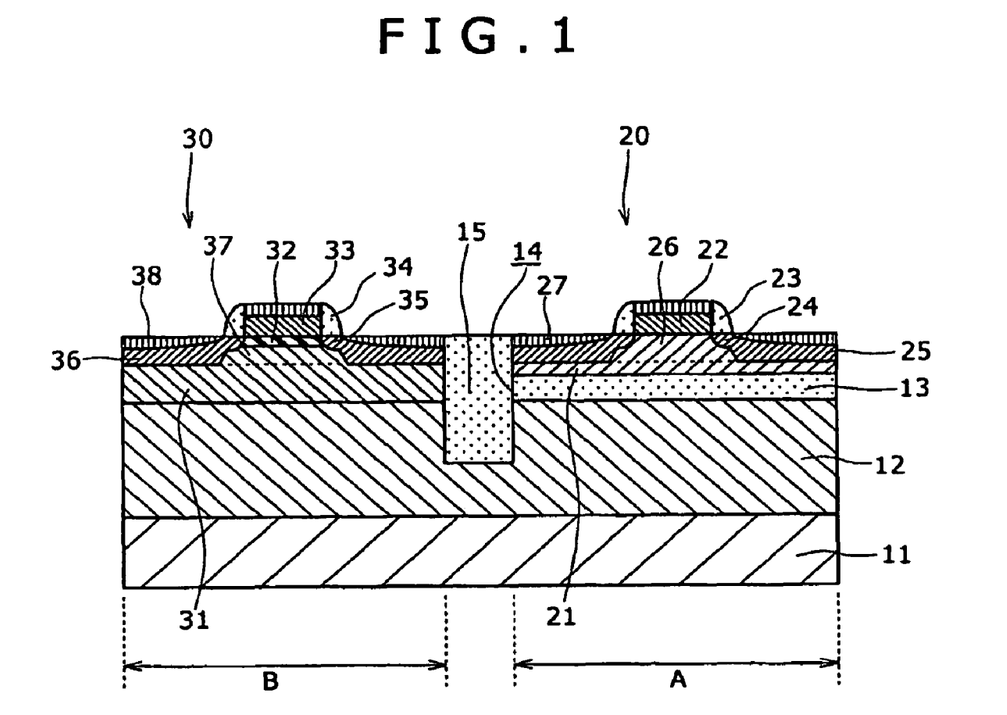
FIG. 1 is a sectional configurational diagram for illustrating a first embodiment of the semiconductor device according to the present invention.

FIG. 1 is a sectional configurational diagram of a CMOS device according to this embodiment. As shown in the figure, a p-type Si substrate (substrate 11) composed of an Si single crystal layer whose surface has a plane orientation of (110) is provided therein with an NMOS region (first device region) A and a PMOS region (second device region) B. On the substrate 11 is provided a relaxed SiGe layer 12 in the state of maintaining the plane orientation (110) of the surface of the substrate 11. Though not shown in the figure, the relaxed SiGe layer 12 is composed, for example, of an inclined SiGe layer containing Ge mixed in an Si layer so that the Ge compositional ratio in the Si layer gradually increases from 0 to x along the upward direction, and an $Si_{1-x}Ge_x$ layer which is provided on the inclined SiGe layer and in which the Ge compositional ratio in the Si layer is x.

In addition, an insulation layer 13 formed of silicon oxide ($SiO_2$) is provided on the relaxed SiGe layer 12 in the NMOS region A, and a strained Si layer 21 composed of a strained layer in a tension-strained state is provided on the insulation layer 13. The strained Si layer 21 is formed to have a plane orientation (100) which is different from the plane orientation (110) of the substrate 11 and which promises a higher electron mobility as compared with other plane orientations. Incidentally, while the strained Si layer 21 in the tension-strained state is used here, the layer is not particularly limited and may be any strained layer in the tension-strained state in as much as the layer can enhance the electron mobility.

As will be detained later in connection with a manufacturing method, the strained layer 21 is formed from, and in the state of maintaining the plane orientation of, a p-type Si substrate (joined substrate) composed of an Si single crystal layer whose surface has a plane orientation of (100), different from that of the first substrate 11. The NMOS region A is in the state of having an SOI (Silicon On Insulator) structure, specifically, an SSOI (Strained-Silicon On Insulator) structure formed by laminating the strained Si layer 21 on the insulation layer 13.

On the other hand, a strained SiGe layer 31 composed of a strained layer in a compression-strained state which is composed of an $Si_{1-y}Ge_y$ layer (x<y) having a Ge compositional ratio higher than that of the $Si_{1-x}Ge_x$ layer of the relaxed SiGe layer 12, for example, is provided on the relaxes SiGe layer 12 in the PMOS region B. The strained SiGe layer 31, by being in the compression-strained layer, is so configured as to be higher in hole mobility than a non-strained Si layer. In addition, the strained SiGe layer 31 is formed by epitaxial growth in the state of maintaining the plane orientation of the relaxed SiGe layer 12, i.e., in the state of maintaining the plane orientation (110) of the surface of the substrate 11, whereby it is provided with a plane orientation (110) which promises a higher hole mobility as compared with other plane orientations. Incidentally, while the strained SiGe layer 31 in the compression-strained state is used here, the layer is not particularly limited and may be any strained layer in the compression-strained state inasmuch as the layer can enhance the hole mobility.

Here, since the coefficient of straining of the strained SiGe layer 31 is determined by the compositional ratio of Si and Ge in the $Si_{1-x}Ge_x$ layer of the relaxed SiGe layer and the compositional ratio of Si and Ge in the strained SiGe layer 31, the compositional ratios in the $Si_{1-x}Ge_x$ layer of the relaxed SiGe layer 12 and in the $Si_{1-y}Ge_y$ layer of the strained SiGe layer 31 are controlled so as to provide the strained SiGe layer 31 with a coefficient of straining which is optimum for enhancing the hole mobility.

In addition, a thin film form cap film 32 formed of Si, for example, is provided on the strained SiGe layer 31. The cap film 32 is necessary for enhancing the interface condition between the strained SiGe layer 31 and a gate electrode 33 which will be described later, and the cap film 32 is so configured that the surface side of the cap film 32 or the cap film 32 itself becomes a gate insulation film by being subjected to a thermal oxidizing treatment.

A trench 14 in the state of reaching the inside of the relaxed SiGe layer 12 is provided on the surface side in the portion between the NMOS region A and the PMOS region B, and a device isolation film 15 formed of $SiO_2$ is provided in the trench 14. An NMOS transistor 20 and a PMOS transistor 30 are provided respectively in the NMOS region A and the PMOS region B thus isolated by the device isolation film 15.

The NMOS transistor 20 has a gate electrode 22 provided on the upper side of the strained Si layer 21 with a gate insulation film (not shown) therebetween, and side walls 23 are provided on both sides of the gate electrode 22. In addition, the strained Si layer 21 is provided, on both sides of the gate electrode 22, with source/drain regions 25 with an LDD region 24 therebetween. Besides, that region in the strained Si layer 21 which is defined between the source/drain regions ($N^+$ type diffusion regions) 25 with the LDD region 24 therebetween constitutes a channel region 26. In addition, a silicide layer 27 is provided on the surface side of the gate electrode 22 and the source/drain regions 25.

On the other hand, the PMOS transistor 30 has a gate electrode 33 provided on the upper side of the strained SiGe layer 31 with a gate insulation film (cap film 32) therebetween, and side walls 34 are provided on both sides of the gate electrode 33. In addition, the strained SiGe layer 31 is provided, on both sides of the gate electrode 33, with source/drain regions ($P^+$ type diffusion regions) 36 with an LDD region 35 therebetween. Besides, that region in the strained SiGe layer 31 which is defined between the source/drain regions 36 with the LDD region 35 therebetween constitutes a channel region 37. In addition, a silicide layer 38 is provided on the surface side of the gate electrode 33 and the source/drain regions 36.

Figure 2A:
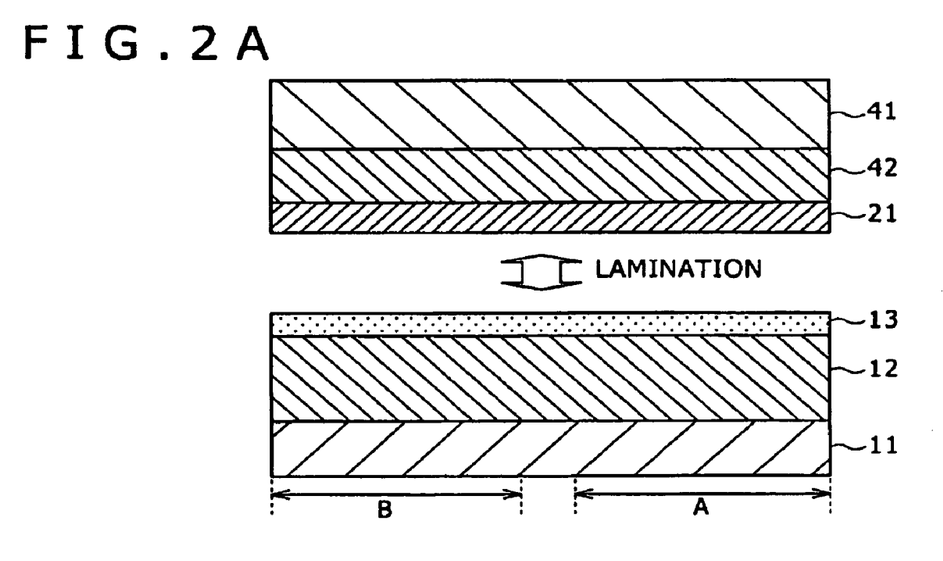
FIGS. 2A to 2L are manufacturing step sectional diagrams for illustrating a first embodiment of the method of manufacturing a semiconductor device according to the present invention.
Figure 3:
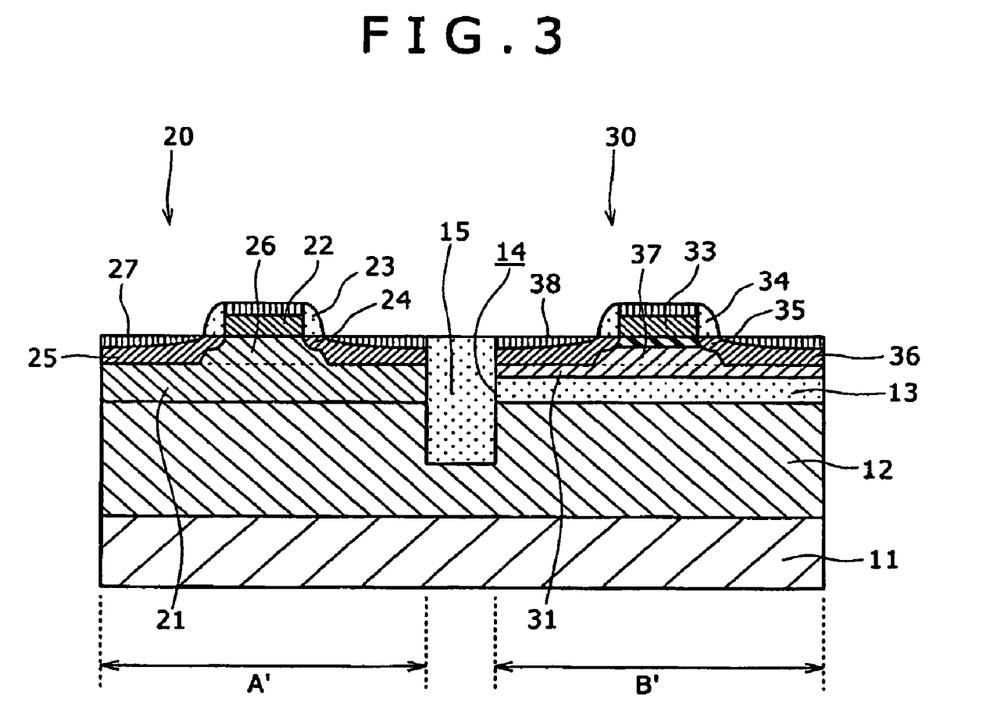
FIG. 3 is a sectional configurational diagram for illustrating a second embodiment of the semiconductor device according to the present invention.

Now, a method of manufacturing the above-described CMOS device is illustrated in manufacturing step sectional diagrams shown in FIGS. 2A to 3.

As shown in FIG. 2A, for example, a substrate 11 composed of a p-type Si substrate obtained by growing an Si single crystal layer with a surface plane orientation of (110) is provided with an NMOS region (NMOS forming region) A for forming an NMOS transistor in the subsequent step, and with a PMOS region (PMOS forming region) B for forming a PMOS transistor. Here, the NMOS region A corresponds to the first device region set forth in the claims, and the PMOS region B to the second device region.

First, a relaxed SiGe layer 12 is epitaxially grown on the substrate 11 in the state of maintaining the plane orientation (110) of the surface. In this case, an inclined SiGe layer with the compositional ratio of Si and Ge gradually increasing from 0 to x in the direction toward the upper layer is epitaxially grown, and thereafter an $Si_{1-x}Ge_x$ layer with the compositional ratio of Si and Ge being 1-x:x is epitaxially grown on the inclined SiGe layer, thereby forming the relaxed SiGe layer 12 composed of the inclined SiGe layer and the $Si_{1-x}Ge_x$ layer.

Here, the coefficient of straining of a strained SiGe layer formed on the relaxed SiGe layer 12 in the PMOS region B in the subsequent step is determined by the compositional ratio of Si and Ge in the $Si_{1-x}Ge_x$ layer of the relaxed SiGe layer 12 and the compositional ratio of Si and Ge in the strained SiGe layer, and the strained SiGe layer is provided with a channel region of a PMOS transistor; therefore, the compositional ratios in the relaxed SiGe layer 12 and the $Si_{1-x}Ge_x$ layer are so set as to provide a coefficient of straining which is optimum for enhancing the hole mobility.

Next, an insulation layer 13 formed of $SiO_2$, for example, is formed on the relaxed SiGe layer 12. Here, by regulating the film thickness of the insulation layer 13, the height of the surface of the NMOS region A provided by forming the strained Si layer on the insulation layer 13 is controlled. This ensures that, in the latter step in which the strained Si layer and the insulation layer 13 on the PMOS region B side are removed to expose the relaxed SiGe layer 12 and then the strained SiGe layer is grown on the relaxed SiGe layer 12 to form a surface layer in the PMOS region B, the surface heights of the NMOS region A and the PMOS region B are controlled to be roughly equal to each other.

On the other hand, on a joined substrate 41 composed of a p-type Si substrate having a plane orientation different from the plane orientation (110) of the surface of the substrate 11, for example, a surface plane orientation of (100), a relaxed SiGe layer 42 is epitaxially grown in the state of maintaining the plane orientation (100). In this case, an inclined SiGe layer with a compositional ratio of Ge to Si gradually increasing from 0 to z in the direction toward the upper layer is epitaxially grown, and thereafter an $Si_{1-z}Ge_z$ layer with a compositional ratio of Si and Ge being 1-z:z is epitaxially grown on the inclined SiGe layer, thereby forming the relaxed SiGe layer 42 composed of the relaxed SiGe layer and the $Si_{1-z}Ge_z$ layer. Here, the coefficient of restraining of a strained Si layer to be formed on the relaxed SiGe layer 42 in the subsequent step is determined by the compositional ratio in the $Si_{1-z}Ge_z$ layer. Then, the strained Si layer is provided with a channel region of an NMOS transistor; therefore, the compositional ratio of Si and Ge in the $Si_{1-z}Ge_z$ layer is so set as to provide a coefficient of straining which is optimum for enhancing the electron mobility.

Subsequently, a strained Si layer (first semiconductor layer) 21 in a tension-strained state is formed on the relaxed SiGe layer 42. Here, the height of the surface of the NMOS region A can be controlled also by the film thickness of the strained Si layer 21, and the film thickness of the strained Si layer 21 is determined, to a certain extent, according to the coefficient of straining; therefore, it is preferable to control the height of the surface of the NMOS region A by the film thickness of the insulation layer 13.

Next, the insulation layer 13 formation side of the substrate 11 and the strained Si layer 21 formation side of the joined substrate 41 are opposed to each other, and the insulation layer 13 and the strained Si layer 21 are laminated on each other. As a result, the strained Si layer 21 having the plane orientation (100), which is different from the plane orientation of the substrate 11, is formed on the substrate 11.

Figure 2B:
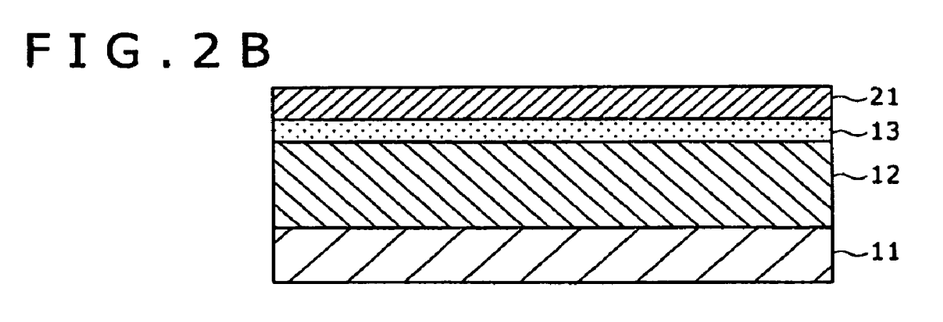

Subsequently, as shown in FIG. 2B, hydrogen is introduced into the joined substrate 41 (see FIG. 2A) and the relaxed SiGe layer 42 (see FIG. 2A), and the joined substrate 41 and the relaxed SiGe layer 42 are removed by etching, whereby the substrate 11 is provided with an SOI structure, specifically an SSOI structure, in which the strained Si layer 21 is provided on the insulation film 13.

Figure 2C:
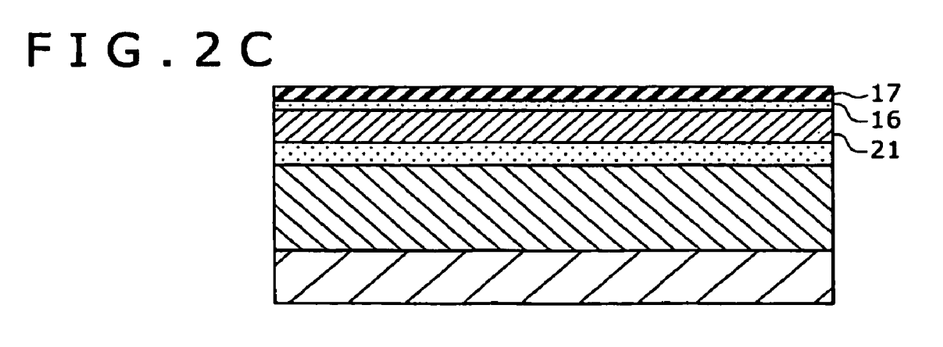
Figure 2D:
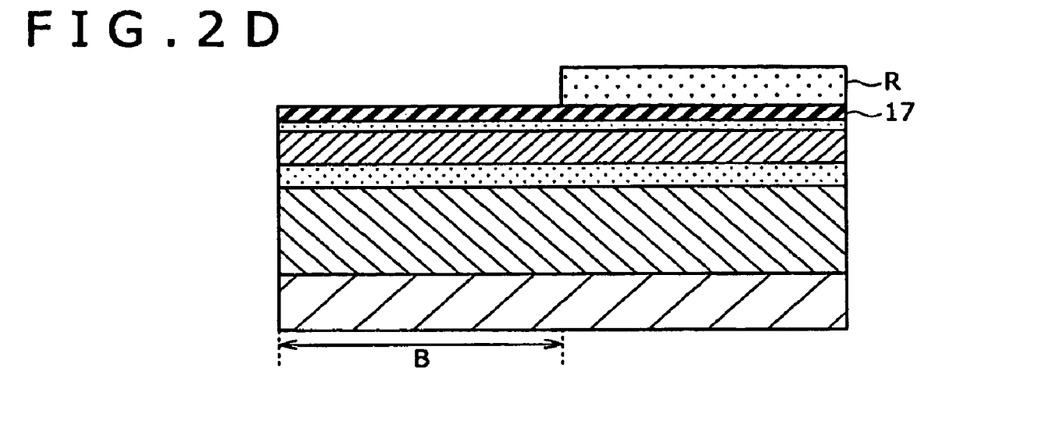
Figure 2E:
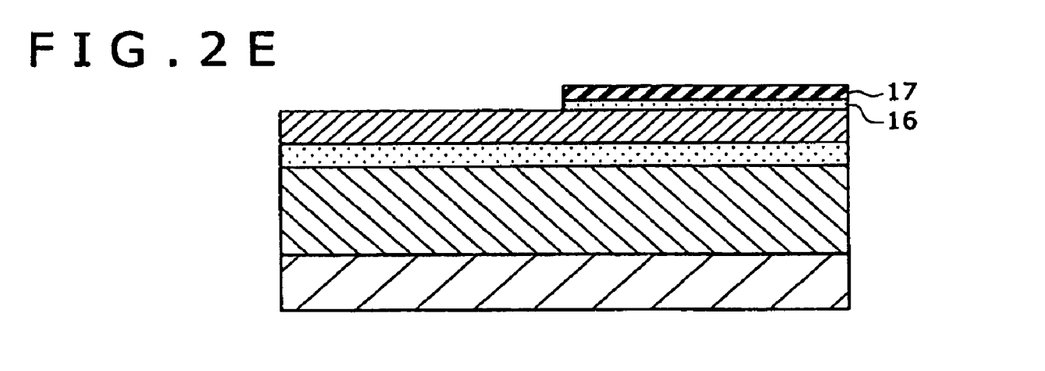

Next, as shown in FIG. 2C, an $SiO_2$ film 16 is formed on the strained Si layer 21, and a silicon nitride (SiN) layer 17 is formed on the $SiO_2$ film 16. Subsequently, as shown in FIG. 2D, a resist pattern R is formed in the condition where the SiN film 17 on the PMOS region B side is exposed. Next, as shown in FIG. 2E, etching is conducted using the resist pattern R (see FIG. 2D) as a mask, whereby the SiN film 17 and the $SiO_2$ film 16 are removed. Thereafter, the resist pattern R is removed.

Figure 2F:
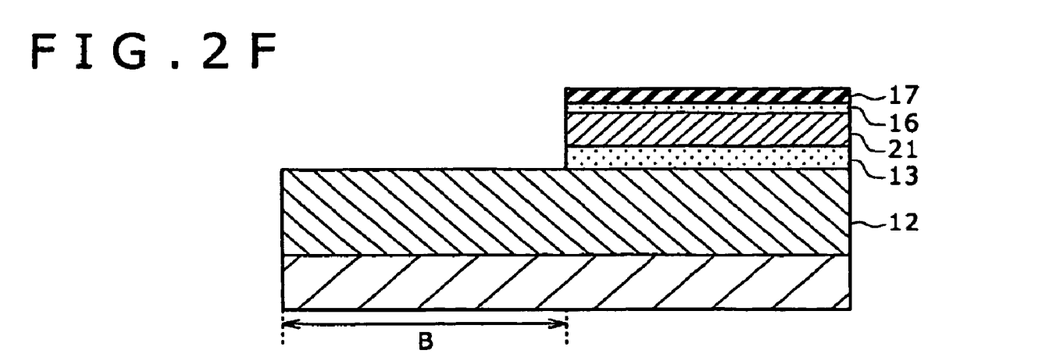

Subsequently, as shown in FIG. 2F, etching is conducted using the SiN film 17 and the $SiO_2$ film 16 as a mask, to remove the strained Si layer 21 and the insulation layer 13 on the PMOS region B side, thereby exposing the surface of the relaxed SiGe layer 12.

Figure 2G:
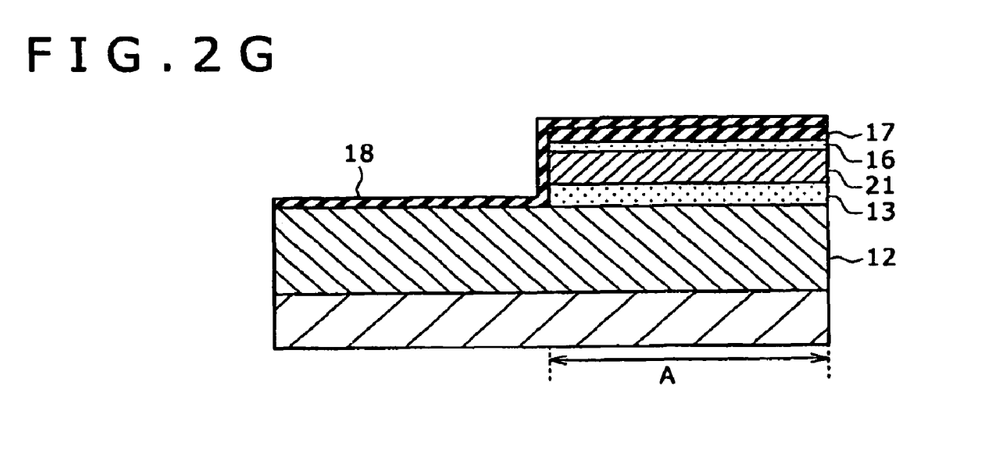
Figure 2H:
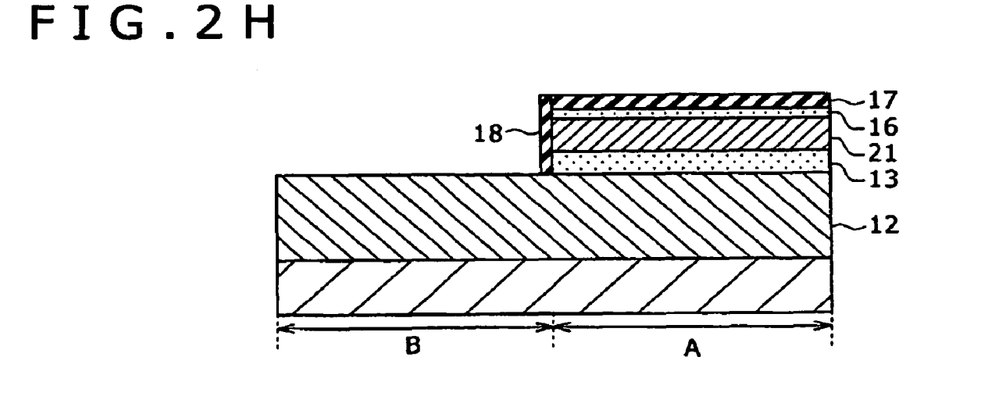

Next, as shown in FIG. 2G, a protective film 18 formed of SiN is formed on the relaxed SiGe layer 12 in the state of covering the SiN film 17, the $SiO_2$ film 16, the strained Si layer 21 and the insulation layer 13 on the NMOS region A side. Thereafter, as shown in FIG. 2H, the protective film 18 is etched back, whereby the protective film 18 in the state of covering the side surfaces of the insulation layer 13, the strained Si layer 21, the $SiO_2$ film 16 and the SiN film 17 is left, and the surface of the relaxed SiGe layer 12 on the PMOS region B side is exposed. The protective film 18 is provided for preventing the SiGe layer from growing sideways from the strained Si layer 21 on the NMOS region A side at the time of epitaxially growing the strained SiGe layer in a compressed state on the relaxed SiGe layer 12 on the PMOS region B side in the subsequent step.

Figure 2I:
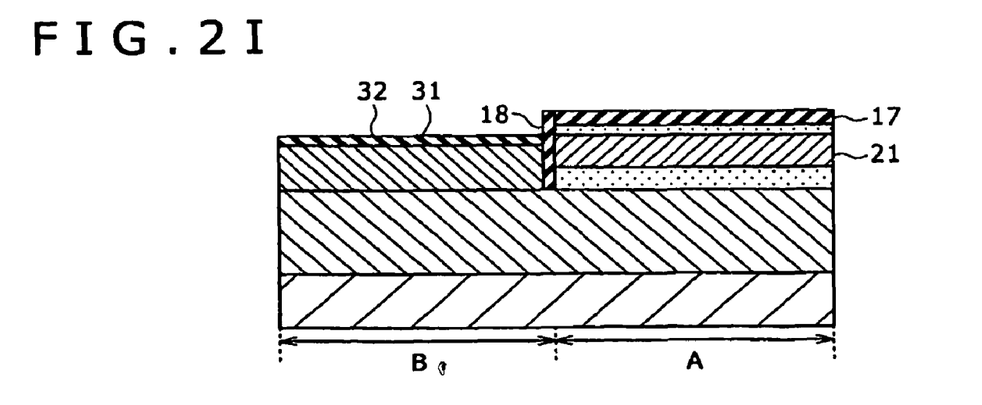

Subsequently, as shown in FIG. 2I, a strained SiGe layer (second semiconductor layer) 31 in a compression-strained state is epitaxially grown on the exposed relaxed SiGe layer 12 on the PMOS region B side. The strained SiGe layer 31 in the compression-strained state is formed of an $Si_{1-y}Ge_y$ layer (x<y) having a Ge compositional ratio higher than that of the $Si_{1-x}Ge_x$ layer on the upper layer side which constitutes the relaxed SiGe layer 12. The strained SiGe layer 31 is to be provided with a channel region of a PMOS transistor in the subsequent step, and, therefore, the compositional ratio of Si and Ge in the $Si_{1-y}Ge_y$ layer is so set as to provide a coefficient of straining which is optimum for enhancing the hole mobility. In this case, besides, it is preferable to grow the strained SiGe layer 31 to a height roughly the same as that of the strained Si layer 21 on the NMOS region A side, and it is more preferable to grow the strained SiGe layer 31 to a height obtained by subtracting the film thickness of a cap film to be formed on the strained SiGe layer 31 in the subsequent step from the preferable height. It should be noted, however, that the film thickness of the strained SiGe layer 31 is determined, to a certain extent, by the coefficient of straining of the strained SiGe layer 31 as above-mentioned, and, therefore, it is preferable to control the height on the NMOS region A side by the film thickness of the insulation layer 13, as has been described referring to FIG. 2A above.

Subsequently, the cap film 32 formed of Si, for example, is formed on the strained SiGe layer 31. In this case, the Si layer is epitaxially grown selectively on the strained SiGe layer 31. This ensures that the cap film 32 composed of the Si layer is formed in a strained state.

Figure 2J:
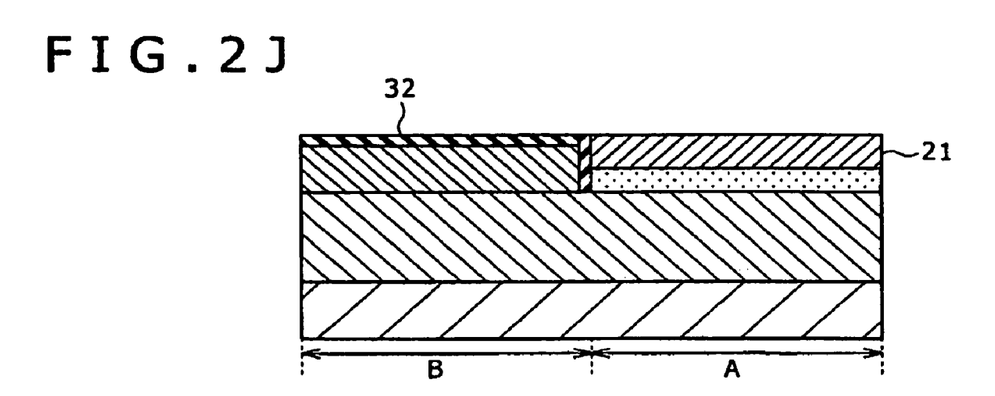

Next, as shown in FIG. 2J, the SiN film 17 (see FIG. 2I) and the $SiO^2$ film 16 (see FIG. 2I) on the NMOS region A side are removed, to expose the surface of the strained Si layer 21. In this case, the height of the surface of the strained Si layer 21 on the NMOS region A side is set to be roughly equal to the height of the surface of the cap film 32 on the PMOS region B side.

Figure 2K:
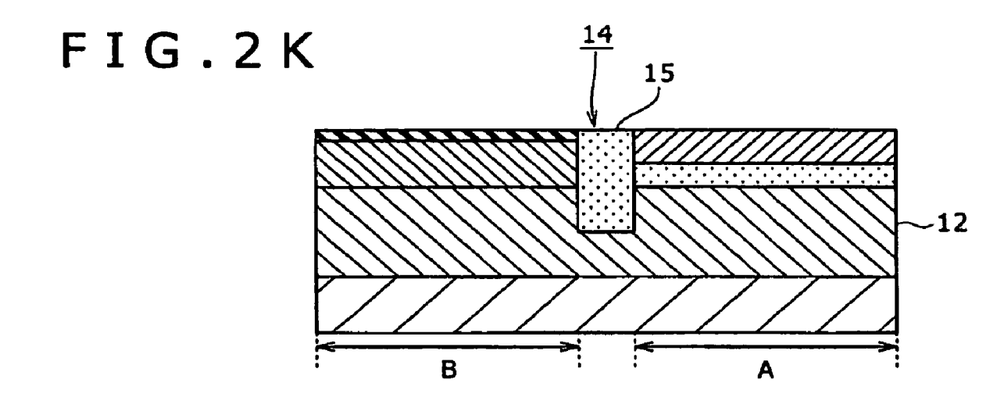

Next, as shown in FIG. 2K, a device isolation region for isolating the devices is formed between the NMOS region A and the PMOS region B by the ordinary STI (Shallow Trench Isolation) technology. Specifically, a trench 14 having such a depth as to reach the inside of the relaxed SiGe layer 12 is formed in the region including the protective film 18 (see FIG. 2J) between the NMOS region A and the PMOS region B by etching using a resist pattern (omitted in the figure) as a mask, and the inside of the trench 14 is filled with a device isolation film 15 formed of $SiO^2$, for example.

Figure 2L:
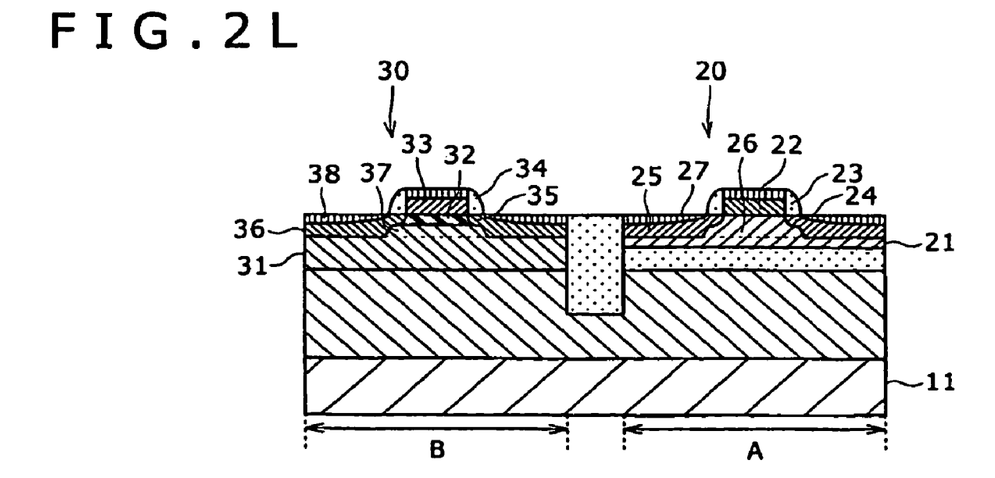

The steps thereafter are the same as those for an ordinary CMOS transistor. Namely, as shown in FIG. 2L, by a thermal oxidizing treatment, a gate insulation film (omitted in the figure) composed of $SiO^2$ is formed on the surface of the strained Si layer 21 in the NMOS region A and on the surface of the cap film 32 in the PMOS region B. In this case, only the surface side of the cap film 32 may be oxidized, or the whole region in the film thickness direction of the cap film 32 may be oxidized. Subsequently, a gate electrode film (omitted in the figure) is formed on the gate insulation film, and the gate electrode film is patterned, to form gate electrodes 22 and 33 respectively in the NMOS region A and the PMOS region B.

Next, an n-type impurity composed of arsenic ($As^+$), for example, is introduced into the surface side of the strained Si layer 21 on both sides of the gate electrode 22 in the NMOS region A, to form LDD regions 24. Besides, a p-type impurity composed of boron ($B^+$), for example, is introduced into the surface side of the gate electrode 33 in the PMOS region B, to form LDD regions 35. Thereafter, an insulation film (omitted in the figure) composed of $SiO_2$, for example, is formed on the strained SiGe layer 31 and on the strained Si layer 21 so as to cover the gate electrodes 22 and 33. Subsequently, the insulation film is etched back (removed) by reactive ion etching, and side walls 23 and 34 are formed respectively at side walls of the gate electrodes 22 and 33.

Subsequently, an n-type impurity composed of $As^+$ is introduced into the surface side of the strained Si layer 21 on both sides of the gate electrode 22 provided with the side wall 23 in the NMOS region A, to form source/drain (SD) regions 25. Besides, a p-type impurity composed of $B^+$ is introduced into the surface side of the strained SiGe layer 31 on both sides of the gate electrode 33 provided with the side wall 34 in the PMOS region B, to form SD regions 36. Thereafter, a heat treatment at 800-1500° C. is conducted in an inert gas atmosphere, whereby the impurities in the LDD regions 24, 35 and the SD regions 25, 36 are diffused, to achieve activation. As a result, a channel region 26 defined between the source/drain regions 25 with the LDD region 24 therebetween is formed in the strained Si layer 21 in the NMOS region A, whereas a channel region 37 defined between the SD regions 36 with the LDD region 35 therebetween is formed in the strained SiGe layer 31 in the PMOS region B.

Thereafter, a high melting point metal film (omitted in the figure) composed of cobalt (Co) or nickel (Ni), for example, is formed on the entire surfaces of the strained SiGe layer 31, the device isolation film 15 and the stained Si layer so as to cover the gate electrodes 22 and 33 provided with the side walls 23 and 34. Next, a heat treatment is conducted to silicidize the surface side of the gate electrodes 22, 33 and the SD regions 25, 36. By this, a semiconductor device having silicide layers 27, 38 formed on the surface side of the gate electrode 22, 33 and the SD regions 25, 36 can be obtained. Thereafter, the unreacted high melting point metal film is removed.

According to the semiconductor device and the method of manufacturing the same as above-described, the channel region 26 in the NMOS region A provided on the substrate 11 is formed in the strained Si layer in the tension-strained state with the plane orientation (100) optimum for enhancing the electron mobility, and the channel region 37 in the PMOS region B on the substrate 11 is formed in the strained SiGe layer 31 in the compression-strained state with the plane orientation (110) optimum for enhancing the hole mobility. This makes it possible to enhance the carrier mobility (electron mobility) in the NMOS transistor 20 of the CMOS device and the carrier mobility (hole mobility) in the PMOS transistor 30 of the CMOS device. Therefore, it is possible to enhance the performance of the CMOS device.

In addition, the heights of the surface layers in the NMOS region A and the PMOS region B are controlled to be roughly equal to each other, whereby generation of a step between the NMOS region A and the PMOS region B is restrained; therefore, contact holes for connection to the transistors formed in the regions can be formed with high accuracy, and the yield of the CMOS device can be enhanced.

Incidentally, while the NMOS transistor 20 is provided in the strained Si layer (first semiconductor layer) 21 in this embodiment, the present invention is not limited to this configuration, and the first semiconductor layer may be a non-strained Si layer. In this case, in the step described above referring to FIG. 2A, a joined substrate 41 composed of an Si layer with a surface plane orientation of (100) is laminated directly on the insulation layer 13 to form an SOI structure for an NMOS transistor 20, and the NMOS transistor 20 is formed on the joined substrate 41. By this, the NMOS transistor 20 can be formed in the first semiconductor layer having a plane orientation (100) which promises a highest electron mobility. It should be noted, however, that it is preferable to form the first semiconductor layer of the strained Si layer 21, since this configuration promises further enhancement of the electron mobility in the NMOS transistor 20.

Besides, while the strained Si layer (first semiconductor layer) 21 with the plane orientation (100) is used for the NMOS region A and the strained SiGe layer (second semiconductor layer) 31 with the plane orientation (110) is used for the PMOS region B in this embodiment, the present invention is not limited to this configuration, and a semiconductor layer with a plane orientation of (111) may be used as either one of the first semiconductor layer and the second semiconductor layer. As has been mentioned in the description of the background art, the electron mobility is higher in the order in terms of plane orientation of (100)>(111)>(110) and the hole mobility is higher in the order in terms of plane orientation of (110)>(111)>(100); therefore, a semiconductor layer having the plane orientation (111) shows a medium level of electron mobility and a medium level of hole mobility.

By thus using the first semiconductor layer with the plane orientation (111) in the NMOS region A, the electron mobility can be enhanced as compared with the case of using a semiconductor layer with a plane orientation of (110). In this case, an Si substrate composed of an Si single crystal layer with a surface plane orientation of (111) as the joined substrate 41, a strained Si layer 21 with a plane orientation of (111) is formed in the condition of maintaining the plane orientation, with a relaxed SiGe layer 42 therebetween, and it is laminated on the insulation layer 13.

In addition, by using the second semiconductor layer with the plane orientation (111) in the PMOS region B, the hole mobility can be enhanced as compared with the case of using a semiconductor layer with a plane orientation of (100). In this case, an Si substrate composed of an Si single crystal layer with a surface lane orientation of (111) as the substrate 11, and, in the condition of maintaining this plane orientation, a strained SiGe layer with a plane orientation of (111) is epitaxially grown, with a relaxed SiGe layer 12 therebetween.

It should be noted, however, that it is preferable to use the first semiconductor layer with the plane orientation (100) as the NMOS region A and to use the second semiconductor layer with the plane orientation (110) in the PMOS region B, since the electron mobility and the hole mobility can thereby be further enhanced.

Second Embodiment

FIG. 3 shows a sectional configurational diagram of a CMOS transistor in this embodiment. As shown in the figure, in this embodiment, an example will be described in which a p-type Si substrate composed of an Si single crystal layer with a surface plane orientation of (100) is used as the substrate 11 in the first embodiment, and a PMOS region (first device region) B' and an NMOS region (second device region) A' are provided on the substrate 11. Incidentally, the same configurations as in the first embodiment will be denoted by the same symbols as used above, in the following description.

As shown in the figure, a relaxed SiGe layer 12 is provided on the substrate 11 in the state of maintaining the plane orientation (100) of the surface of the substrate 11. Though omitted in the figure, the relaxed SiGe layer 12 is composed, for example, of an inclined SiGe layer containing Ge mixed in an Si layer so that the compositional ratio of Ge in the Si layer gradually increases from 0 to x in the direction toward the upper layer, and an $Si_{1-x}Ge_x$ layer which is provided on the inclined SiGe layer and in which the compositional ratio of Ge in the Si layer is x.

Here, the coefficient of straining of a strained Si layer 21 provided on the relaxed SiGe layer 12 is determined by the compositional ratio of Si and Ge in the $Si_{1-x}Ge_x$ layer of the relaxed SiGe layer 12, and, therefore, the compositional ratio in the $Si_{1-x}Ge_x$ layer of the relaxed SiGe layer 12 is so controlled as to provide the strained Si layer 21 with a coefficient of straining which is optimum for enhancing the electron mobility.

In addition, an insulation layer 13 composed of SiO2 is provided on the relaxed SiGe layer 12 in the PMOS region B', and a strained SiGe layer (first semiconductor layer) 31 in a compression-strained state is provided on the insulation layer 13. The strained SiGe layer 31 is formed to have a plane orientation of (110) which is different from the plane orientation (100) of the substrate 11 and which can enhance the hole mobility as compared with other plane orientations. Besides, the strained SiGe layer 31, by being in the compression-strained state, is configured to promise a higher hole mobility as compared with a non-strained Si layer.

As will be detailed in the manufacturing method which will be described later, the strained SiGe layer 31 is formed from, and in the state of maintaining the plane orientation of, a p-type Si substrate (joined substrate) composed of an Si single crystal layer whose surface has a plane orientation of (110), different from that of the substrate 11. The PMOS region B' is configured in the condition where the strained SiGe layer 31 is laminated on the insulation layer 13. In addition, a thin film form cap film 32 formed of Si, for example, is provided on the strained SiGe layer 31.

On the other hand, on the relaxed SiGe layer 12 in the NMOS region A' is provided a strained Si layer (second semiconductor layer) 21 in a tension-strained state. The strained Si layer 21, by being in the tension-strained state, is configured to have a higher electron mobility as compared with a non-strained layer. In addition, the strained Si layer 21 is provided in the state of maintaining the plane orientation of the relaxed SiGe layer 12, i.e., in the state of maintaining the plane orientation (100) of the surface of the substrate 11, so that it has the plane orientation of (100) which enhances the electron mobility as compared with other plane orientations. Incidentally, while the strained Si layer 21 in the tension-strained state is provided here, the strained layer is not particularly limited inasmuch as it is a strained layer in a tension-strained state which can enhance the electron mobility.

A trench 14 in the state of reaching the inside of the relaxed SiGe layer 12 is provided on the surface side between the NMOS region A' and the PMOS region B', and a device isolation film 15 composed of SiO.sub.2 is provided in the trench 14. The NMOS region A' and the PMOS region B' isolated by the device isolation film 15 are provided respectively with an NMOS transistor 20 and a PMOS transistor 30. These transistors are configured in the same manner as in the first embodiment.

Namely, the NMOS transistor 20 has a gate electrode 22 provided on the upper side of the strained Si layer 21, with a gate insulation film (omitted in the figure) therebetween, and side walls 23 are provided on both sides of the gate electrode 22. In addition, SD regions 25 are formed in the strained Si layer 21 on both sides of the gate electrode 22, with an LDD region 24 therebetween. Then, that region of the strained Si layer 21 which is defined between the SD regions (N⁺ type diffusion regions) 25, with the LDD region 24 therebetween, constitutes a channel region 26. Besides, a silicide layer 27 is provided on the surface side of the gate electrode 22 and the SD regions 25.

On the other hand, the PMOS transistor 30 has a gate electrode 33 formed on the upper side of the strained SiGe layer 31, with a gate insulation film (cap film 32) therebetween, and side walls 34 are provided on both sides of the gate electrode 33. In addition, SD regions (P⁺ type diffusion regions) 36 are formed in the strained SiGe layer 31 on both sides of the gate electrode 33, with an LDD region 35 therebetween. Then, that region of the strained SiGe layer 31 which is defined between the SD regions 36, with the LDD region 35 therebetween, constitutes a channel region 37. Besides, a silicide layer 38 is provided on the surface side of the gate electrode 33 and the SD regions 36.

Now, a method of manufacturing the above-described CMOS device is illustrated in manufacturing step sectional diagrams in FIGS. 4A to 4L.

Figure 4A:
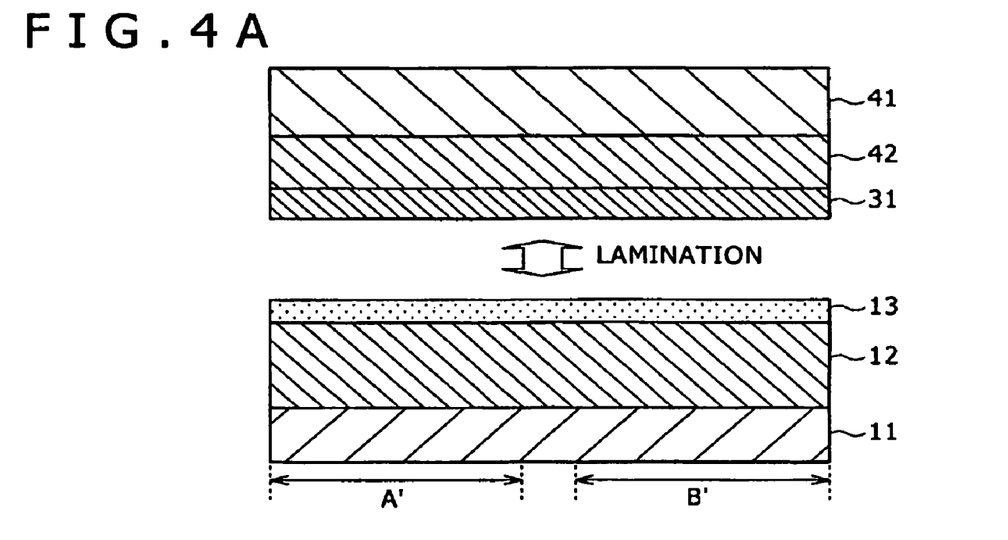
FIGS. 4A to 4L are manufacturing step sectional diagrams for illustrating the second embodiment of the method of manufacturing a semiconductor device according to the present invention.

As shown in FIG. 4A, a substrate 11 composed of a p-type Si substrate obtained by growing an Si single crystal layer whose surface has a plane orientation of (100), for example, is provided with an NMOS region (NMOS forming region) A' for forming an NMOS transistor in a latter step and a PMOS region (PMOS forming region) B' for forming a PMOS transistor in a latter step. Here, the NMOS region A' corresponds to the second device region in the claims, and the PMOS region B' to the first device region.

First, a relaxed SiGe layer 12 is epitaxially grown on the substrate 11 in the state of maintaining the plane orientation (100) of the substrate 11. In this case, an inclined SiGe layer with the compositional ratio of Ge to Si gradually increasing from 0 to x in the direction toward the upper layer is epitaxially grown, and thereafter an Si.sub.1-xGe.sub.x layer with the compositional ratio of Si and Ge being 1-x:x is epitaxially grown on the inclined SiGe layer, to form the relaxed SiGe layer 12 composed of the inclined SiGe layer and the Si.sub.1-xGe.sub.x layer.

Here, the coefficient of straining of a strained Si layer to be formed on the relaxed SiGe layer 12 in a latter step is determined by the compositional ratios of Si and Ge in the relaxed SiGe layer and the $Si_{1-x}Ge_x$ layer, and the strained Si layer is to be provided with a channel region for an NMOS transistor; therefore, the compositional ratios in the relaxed SiGe layer 12 and the $Si_{1-x}Ge_x$ layer are so set as to provide a coefficient of straining which is optimum for enhancing the electron mobility.

Next, an insulation layer 13 composed of SiO.sub.2, for example, is formed on the relaxed SiGe layer 12. Here, by regulating the film thickness of the insulation layer 13, the height of the surface of a PMOS region B' provided by forming a strained SiGe layer and a cap film on the insulation layer 13 is controlled. This ensures that in the subsequent step in which the strained SiGe layer and the insulation layer 13 on the NMOS region A' side are removed to expose the relaxed SiGe layer 12 and then a strained Si layer is grown on the relaxed SiGe layer 12 to form a surface layer of the NMOS region A', the heights of the surfaces of the NMOS region A' and the PMOS region B' are controlled to be roughly equal to each other.

On the other hand, a relaxed SiGe layer 42 is epitaxially grown on a joined substrate 41 composed of a p-type Si substrate having a surface plane orientation of (110) different from the plane orientation (100) of the surface of the substrate 11, in the state of maintaining the plane orientation (110) of the joined substrate 41. In this case, an inclined SiGe layer in which the compositional ratio of Ge to Si gradually increases from 0 to z in the direction toward the upper layer is epitaxially grown, and thereafter an $Si_{1-z}Ge_z$ layer with a compositional ratio of Si and Ge being 1-z:z is epitaxially grown on the inclined SiGe layer, thereby forming the relaxed SiGe layer 42 composed of the inclined SiGe layer and the $Si_{1-z}Ge_z$ layer.

Here, the coefficient of straining of a strained SiGe layer to be formed on the relaxed SiGe layer 42 in the subsequent step is determined by the compositional ratio of Si and Ge in the Si.sub.1-zGe.sub.z layer of the relaxed SiGe layer 42 and the compositional ratio of Si and Ge in the strained SiGe layer, and a channel region for a PMOS transistor is formed in the strained SiGe layer; therefore, the compositional ratio in the $Si_{1-z}Ge_z$ layer is so set as to provide a coefficient of straining which is optimum for enhancing the hole mobility.

Subsequently, the strained SiGe layer (first semiconductor layer) 31 in a compression-strained state is epitaxially grown on the relaxed SiGe layer 42. The strained SiGe layer 31 in the compression-strained state is formed of an $Si_{1-y}Ge_y$ (z<y) having a Ge compositional ratio higher than that of the $Si_{1-z}Ge_z$ layer on the upper layer side constituting the relaxed SiGe layer 42. A channel region for a PMOS transistor is to be formed in the strained SiGe layer 31 in a latter step, and, therefore, the compositional ratio of Si and Ge in the $Si_{1-y}Ge_y$ layer is so set as to provide a coefficient of straining which is optimum for enhancing the hole mobility. Here, the height of the surface of the PMOS region B can be controlled also by the film thickness of the strained SiGe layer 31. However, since the film thickness of the strained SiGe layer 31 is determined, to a certain extent, according to the coefficient of straining, it is preferable to control the height of the surface of the PMOS region B' by the film thickness of the insulation layer 13, as has been mentioned above.

Next, the insulation layer 13 formed side of the substrate 11 and the strained SiGe layer 31 formed side of the joined substrate 41 are opposed to each other, and the insulation layer 13 and the strained SiGe layer 31 are laminated on each other. As a result, the strained SiGe layer 31 having a plane orientation (110) different from the plane orientation of the substrate 11 is formed on the substrate 11.

Figure 4B:
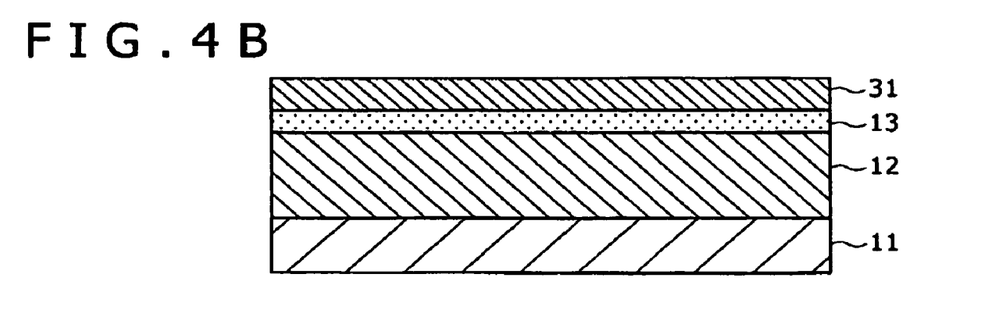

Thereafter, as shown in FIG. 4B, hydrogen is introduced into the joined substrate 41 (see FIG. 4A) and the relaxed SiGe layer 42 (see FIG. 4A), and the joined substrate 41 and the relaxed SiGe layer 42 are removed by etching, whereby the substrate 11 is brought into the condition where the strained SiGe layer 31 is provided on the insulation layer 13.

Figure 4C:
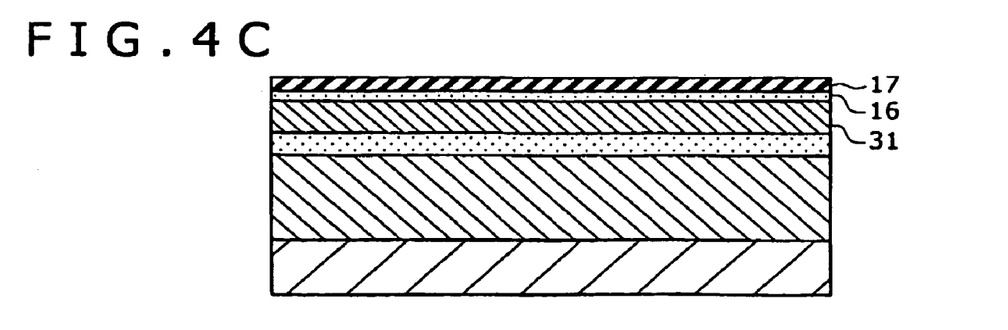
Figure 4D:
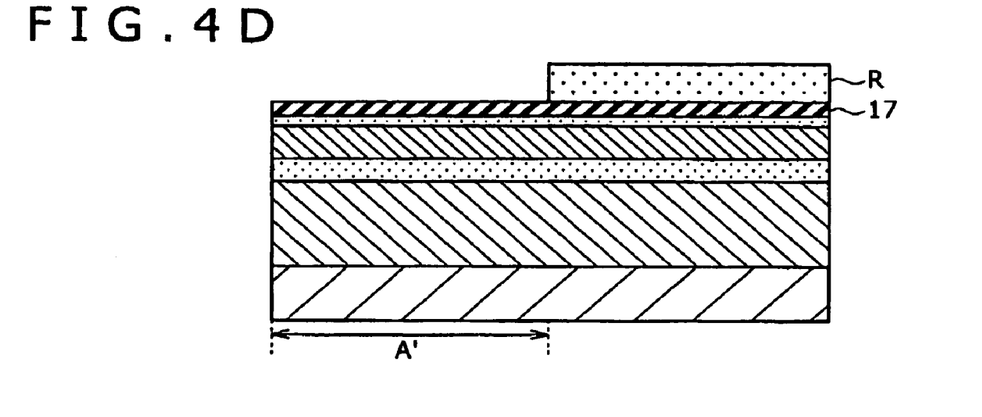
Figure 4E:
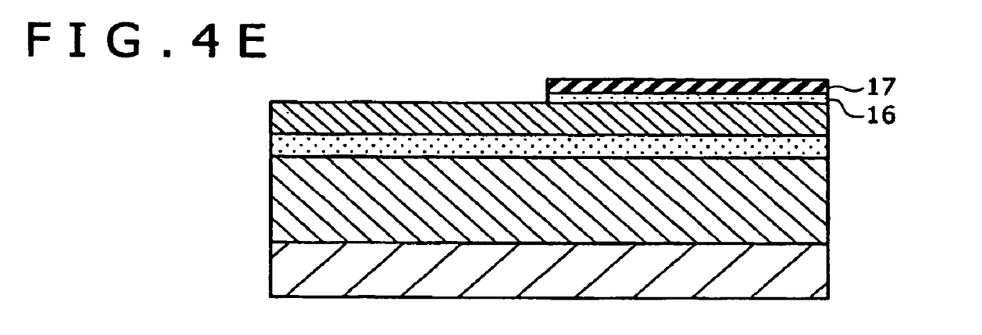

Next, as shown in FIG. 4C, an $SiO_2$ film 16 is formed on the strained SiGe layer 31, and then an SiN film 17 is formed on the $SiO_2$ film 16. Subsequently, as shown in FIG. 4D, a resist pattern R is formed in the condition where the SiN film 17 on the NMOS region A' side is exposed. Next, as shown in FIG. 4E, by etching using the resist pattern R (see FIG. 4D) as a mask, the SiN film 17 and the $SiO_2$ film 16 are removed. Thereafter, the resist pattern R is removed.

Figure 4F:
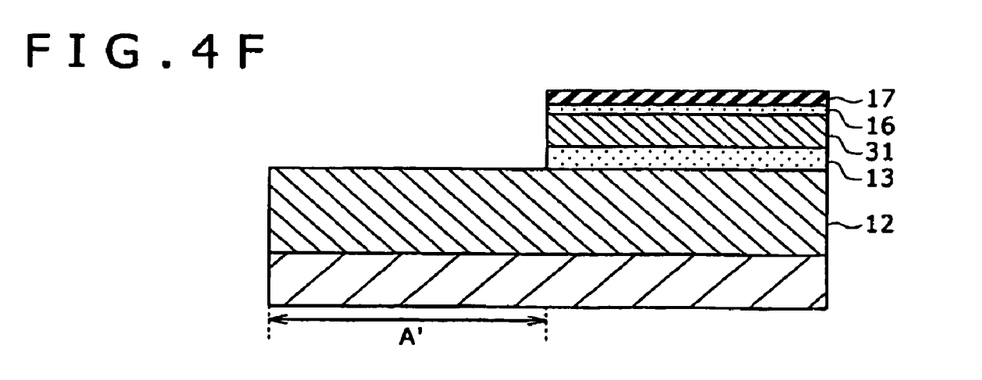

Subsequently, as shown in FIG. 4F, the strained SiGe layer 31 and the insulation layer 13 on the NMOS region A' side are removed by etching using the SiN film 17 and the $SiO_2$ film 16 as a mask, whereby the surface of the relaxed SiGe layer 12 is exposed.

Figure 4G:
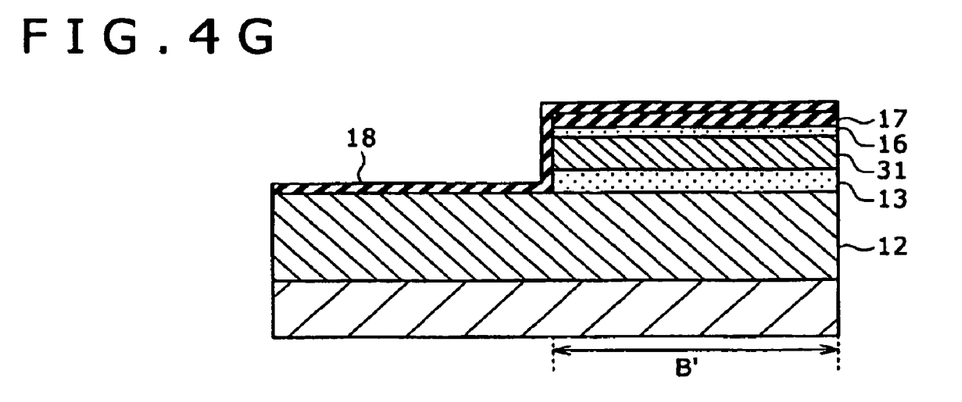
Figure 4H:
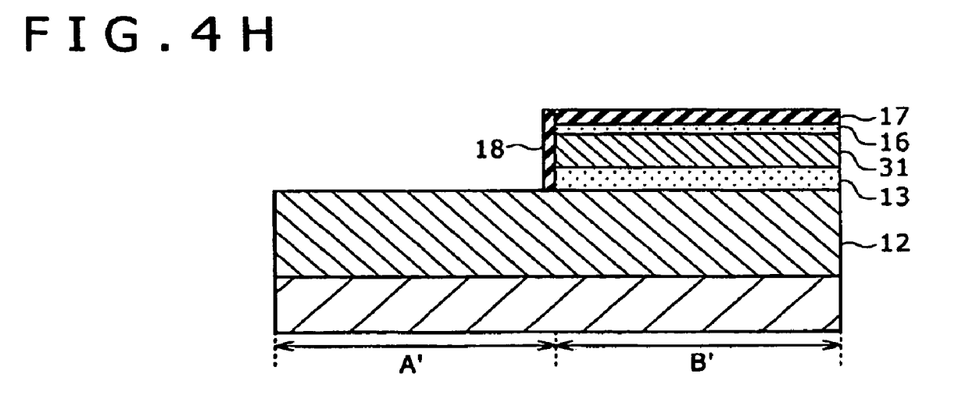

Next, as shown in FIG. 4G, a protective film 18 composed of SiN is formed on the relaxed SiGe layer 12, in the state of covering the SiN film 17, the SiO.sub.2 film 16, the strained SiGe layer 31 and the insulation layer 13 on the PMOS region B' side. Thereafter, as shown in FIG. 4H, the protective film 18 is etched back, whereby the protective film 18 is left in the state of covering the side walls of the insulation layer 13, the strained SiGe layer 31, the $SiO_2$ film 16 and the SiN film 17 on the relaxed SiGe layer 12 on the PMOS region B' side, and the surface of the relaxed SiGe layer 12 on the NMOS region A' side is exposed. The protective film 18 is provided for preventing an Si layer from growing sideways from the strained SiGe layer 31 on the PMOS region B' side at the time of epitaxially growing a strained Si layer on the relaxed SiGe layer 12 on the NMOS region A' side in the subsequent step.

Figure 4I:
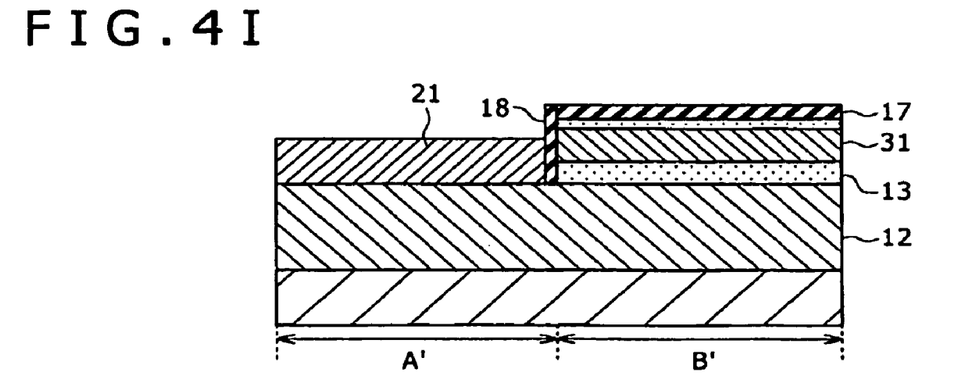

Subsequently, as shown in FIG. 4I, the strained Si layer 21 in a tension-strained state is epitaxially grown on the relaxed SiGe layer 12. In this case, it is preferable to grow the strained Si layer 21 to a height roughly equal to the height of the strained SiGe layer 31 on the PMOS region B' side. It should be noted, however, that since the film thickness of the strained Si layer 21 is determined to a certain extent according to the coefficient of straining of the strained Si layer 21 as abovementioned, it is preferable to control the height of the surface on the PMOS region B' side by the film thickness of the insulation layer 13, as has been described above referring to FIG. 4A.

Figure 4J:
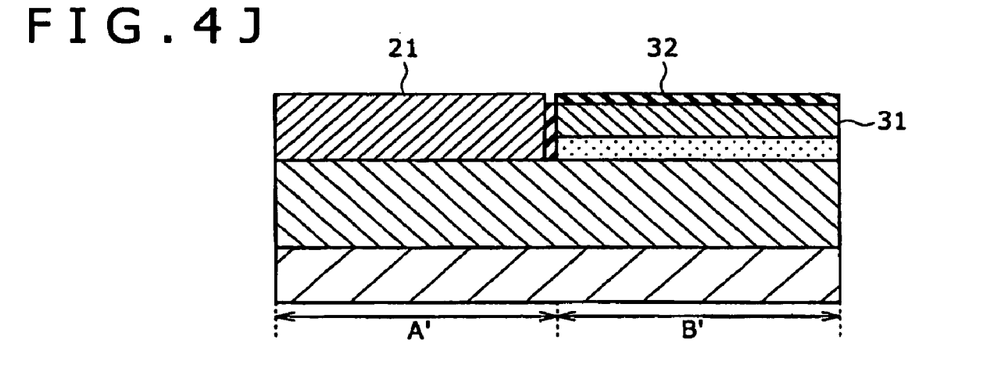

Next, as shown in FIG. 4J, the SiN film 17 (see FIG. 4I) and the SiO.sub.2 film 16 (see FIG. 4I) on the PMOS region B' side are removed, whereby the surface of the strained SiGe layer 31 is exposed. Thereafter, a cap film 32 formed of Si, for example, is formed on the strained SiGe layer 31. In this case, the Si layer is epitaxially grown on the strained SiGe layer 31. By this, the cap film 32 composed of the Si layer is formed in a strained state. Besides, since the surface of the strained Si layer 21 is also exposed, the condition where the Si layer is further grown on the strained Si layer 21 is obtained.

Incidentally, while the cap film 32 is formed by exposing the surface of the strained SiGe layer 31 after the growth of the strained Si layer 21 here, a process may be adopted in which in the step described above referring to FIG. 4B, the strained SiGe layer 31 is formed on the insulation layer 13, and thereafter the Si layer is epitaxially grown on the surface of the strained SiGe layer 31 to thereby form the cap film 32. In this case, the cap film 32 in the NMOS region A' is removed together when the insulation layer 13 and the strained SiGe layer 31 on the NMOS region A' side are removed in the latter step described above referring to FIG. 4F.

Figure 4K:
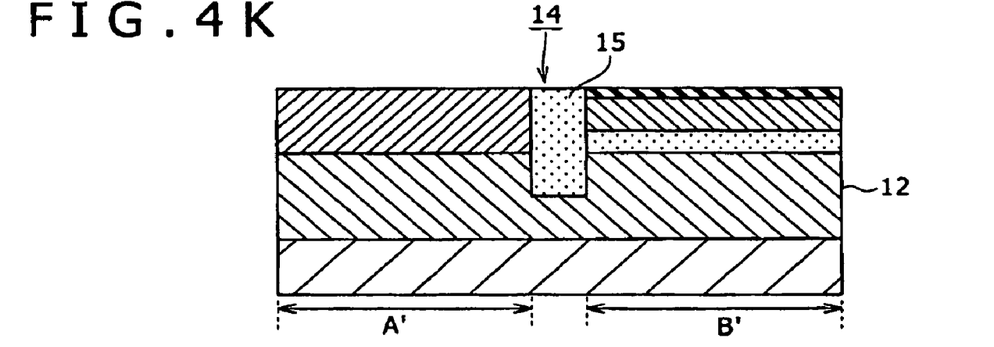

Subsequently, as shown in FIG. 4K, by etching using a resist pattern as a mask, a trench 14 with such a depth as to reach the inside of the relaxed SiGe layer 12 is formed in the region including the protective film 18 (see FIG. 4J) between the NMOS region A' and the PMOS region B', and the inside of the trench 14 is filled with a device isolation film 15 composed of $SiO_2$, for example.

Figure 4L:
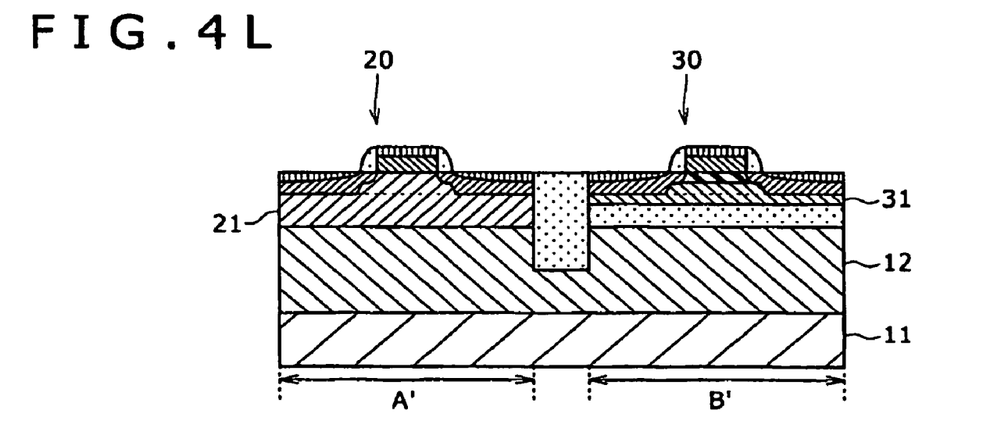

The subsequent steps are carried out by steps similar to those for an ordinary CMOS transistor, in the same manner as in the first embodiment, whereby an NMOS transistor 20 is formed in the NMOS region A' and a PMOS transistor 30 is formed in the PMOS region B', as shown in FIG. 4L.

Even in the semiconductor device and the method of manufacturing the same as above-described, the NMOS transistor 20 is formed in the strained Si layer 21 in the tension-strained state having the plane orientation (100) optimum for enhancing the electron mobility, in the NMOS region A', and the PMOS transistor 30 is formed in the strained SiGe layer 31 in the compression-strained state having the plane orientation (110) optimum for enhancing the hole mobility. This makes it possible to enhance the electron mobility in the NMOS transistor 20 and the hole mobility in the PMOS transistor 30, in the CMOS device. Therefore, it is possible to enhance the performance of the CMOS device.

In addition, since the generation of a step between the NMOS region A' and the PMOS region B' is restrained by controlling the heights of the surfaces of the NMOS region A' and the PMOS region B' to be roughly equal to each other, contact holes for connection to transistors formed in the regions can be formed with high accuracy, and the yield of the CMOS device can be enhanced.

Incidentally, while the PMOS transistor 30 is provided in the strained SiGe layer 31 in this embodiment, the present invention is not limited to this configuration, and the PMOS transistor 30 may be formed in a non-strained Si layer. In this case, in the step described above referring to FIG. 4A, a joined substrate 41 composed of an Si layer whose surface has a plane orientation of (110) is laminated directly on the insulation layer 13. Then, the PMOS transistor 30 is formed on the joined substrate 41. By this, the PMOS transistor 30 can be formed in the first semiconductor layer having a plane orientation (110) optimum for enhancing the hole mobility. It should be noted, however, that it is preferable to form the PMOS transistor 30 in the strained SiGe layer 31 in the compression-strained state, since the hole mobility in the PMOS transistor 30 can thereby be further enhanced.

Besides, while the strained SiGe layer (first semiconductor layer) 31 with the plane orientation (110) is used for the PMOS region (first device region) B' and the strained Si layer (second semiconductor layer) 21 with the plane orientation (100) is used for the NMOS region (second device region) A' in this embodiment, the present invention is not limited to this configuration; a semiconductor layer with a plane orientation of (111) may be used as either one of the first semiconductor layer and the second semiconductor layer, in the same manner as in the first embodiment.

By using the second semiconductor layer with the plane orientation (111) in the NMOS region A', the electron mobility can be enhanced, as compared with the case of using the semiconductor layer with the plane orientation (110). In this case, an Si substrate composed of an Si single crystal layer whose surface has a plane orientation of (111) is used as the substrate 11, and, in the condition of maintaining this plane orientation, the strained Si layer 21 with the plane orientation (111) is epitaxially grown, with the relaxed SiGe layer 12 therebetween.

Besides, by using the first semiconductor layer with the plane orientation (111) in the PMOS region B', the hole mobility can be enhanced, as compared with the case of using the semiconductor layer with the plane orientation (110). In this case, an Si substrate composed of an Si single crystal layer whose surface has a plane orientation of (111) is used as the joined substrate 41, and, in the condition of maintaining this plane orientation, the strained SiGe layer 31 with the plane orientation (111) is formed thereon, with the relaxed SiGe layer 42 therebetween, and it is laminated on the insulation layer 13.

It should be noted, however, that it is preferable to use the second semiconductor layer with the plane orientation (100) in the NMOS region A' and to use the first semiconductor layer with the plane orientation (110) in the PMOS region B', since the electron mobility and the hole mobility can thereby be further enhanced.

It should be understood by those skilled in the art that various modifications, combinations, sub-combinations and alterations may occur depending on design requirements and other factors insofar as they are within the scope of the appended claims or the equivalents thereof.

What is claimed is:

1. A method of manufacturing a semiconductor device comprising a first device region and a second device region in the same substrate, said method comprising the steps of:
   laminating, with an insulation layer formed on said substrate, a first semiconductor layer having a plane orientation different from the surface of said substrate, on said insulation layer;
   exposing said substrate by removing said insulation layer and said first semiconductor layer, in said second device region; and
   epitaxially growing a second semiconductor layer comprised of a strained layer on said exposed substrate in said second device region in the condition of maintaining the plane orientation of the surface of said substrate.

2. A method of manufacturing a semiconductor device as set forth in claim 1, wherein, said first device region is an NMOS transistor region, while said second device region is a PMOS transistor region, said first semiconductor layer with a plane orientation of (100) is laminated on said insulation layer in said laminating step, and said second semiconductor layer comprised of said strained layer in a compression-strained state is epitaxially grown in said epitaxially growing step.

3. A method of manufacturing a semiconductor device as set forth in claim 1, wherein said first device region is a PMOS transistor region, while said second device region is an NMOS transistor region, said first semiconductor layer with a plane orientation of (110) is laminated on said insulation layer in said laminating step, and said second semiconductor layer comprised of said strained layer in a tension-strained state is epitaxially grown in said epitaxially growing step.

4. A method of manufacturing a semiconductor device as set forth in claim 1, wherein said first semiconductor layer is formed of a strained layer.

5. A method of manufacturing a semiconductor device as set forth in claim 4, wherein said first device region is an NMOS transistor region, while said second device region is a PMOS transistor region, said first semiconductor layer comprised of the strained layer in a tension-strained state with a plane orientation of (100) is laminated on said insulation layer in said laminating step, and said second semiconductor layer comprised of the strained layer in a compression-strained state with a plane orientation of (110) is epitaxially grown in said epitaxially growing step.

6. A method of manufacturing a semiconductor device as set forth in claim 4, wherein said first device region is a PMOS transistor region, while said second device region is an NMOS transistor region, said first semiconductor layer comprised of the strained layer in a compression-strained state with a plane orientation of (110) is laminated on said insulation layer in said laminating step, and said second semiconductor layer comprised of the strained layer in a tension-strained state with a plane orientation of (100) is epitaxially grown in said epitaxially growing step.

* * * * *